(12) United States Patent
Nussbaum

(10) Patent No.: US 7,432,793 B2
(45) Date of Patent: Oct. 7, 2008

(54) AMPLIFIER OUTPUT FILTER HAVING PLANAR INDUCTOR

(75) Inventor: Michael B. Nussbaum, Newton, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 11/305,931

(22) Filed: Dec. 19, 2005

(65) Prior Publication Data

US 2007/0139151 A1    Jun. 21, 2007

(51) Int. Cl.
*H01F 27/28* (2006.01)
(52) U.S. Cl. .................................. 336/223; 330/276
(58) Field of Classification Search ................. 336/223
See application file for complete search history.

(56) References Cited

U.S. PATENT DOCUMENTS

| | | | |
|---|---|---|---|
| 3,855,561 A * | 12/1974 | Gottschalt | 336/83 |
| 4,887,061 A | 12/1989 | Matsumura | |
| 5,083,101 A | 1/1992 | Frederick | |
| 5,119,059 A | 6/1992 | Covi et al. | |
| 5,155,676 A | 10/1992 | Spreen | |
| 5,313,176 A | 5/1994 | Upadhyay | |
| 5,353,001 A | 10/1994 | Meinel et al. | |
| 5,565,837 A | 10/1996 | Godek et al. | |
| 5,581,224 A | 12/1996 | Yamaguchi | |
| 5,600,293 A * | 2/1997 | Hunter | 336/182 |
| 5,747,981 A | 5/1998 | Callanan | |
| 5,783,984 A | 7/1998 | Keuneke | |
| 5,801,602 A * | 9/1998 | Fawal et al. | 333/177 |
| 5,883,559 A | 3/1999 | Chan | |
| 5,990,776 A * | 11/1999 | Jitaru | 336/200 |
| 6,229,388 B1 | 5/2001 | Nalbant | |
| 6,326,875 B1 | 12/2001 | Tuovinen | |
| 6,469,916 B1 | 10/2002 | Kerkman et al. | |
| 6,513,230 B2 | 2/2003 | Inoue et al. | |
| 6,600,402 B1 | 7/2003 | LaFleur et al. | |
| 6,617,950 B2 | 9/2003 | Gilmore et al. | |
| 6,642,672 B2 | 11/2003 | Hu et al. | |
| 6,690,256 B2 | 2/2004 | Ohashi et al. | |
| 6,768,408 B2 | 7/2004 | Gilmore et al. | |

(Continued)

FOREIGN PATENT DOCUMENTS

EP    1 211 701 A1    6/2002

(Continued)

OTHER PUBLICATIONS

Robert Balog, et al., Coupled Inductors—A Basic Filter Building Block, www.coilwinding.org, Electrical Manufacturing Coil Winding Association News, Winter 2002, Oct. 15-17, 2002.

(Continued)

*Primary Examiner*—Elvin Enad
*Assistant Examiner*—Joselito Baisa
(74) *Attorney, Agent, or Firm*—Fish & Richardson P.C.

(57) ABSTRACT

An output filter for an audio amplifier includes a printed circuit board having at least one aperture extending through the printed circuit board. The output filter includes a first coil winding formed on a layer of the printed circuit board. The first coil winding substantially surrounds the first aperture. A magnetic core includes at least one leg. The at least one leg passes through the at least one aperture.

28 Claims, 16 Drawing Sheets

U.S. PATENT DOCUMENTS

| | | | |
|---|---|---|---|
| 6,844,804 | B2 | 1/2005 | Gijs |
| 6,903,648 | B2 | 6/2005 | Baumann et al. |
| 7,042,323 | B2 * | 5/2006 | Joerg et al. ............... 336/184 |
| 7,280,026 | B2 | 10/2007 | Chandrasekaran et al. |
| 2002/0002771 | A1 | 1/2002 | Lin et al. |
| 2003/0067349 | A1 | 4/2003 | Muramatsu |
| 2003/0080844 | A1 | 5/2003 | Nishikawa et al. |
| 2003/0186674 | A1 | 10/2003 | Keeney et al. |
| 2004/0252825 | A1 | 12/2004 | Sedio et al. |
| 2006/0097835 | A1 | 5/2006 | Tomonari et al. |
| 2006/0125586 | A1 | 6/2006 | Lee et al. |
| 2006/0209576 | A1 | 9/2006 | Yasumura |
| 2006/0255899 | A1 | 11/2006 | Lee et al. |
| 2007/0139151 | A1 | 6/2007 | Nussbaum |

FOREIGN PATENT DOCUMENTS

| | | |
|---|---|---|
| EP | 1 255 349 | 11/2002 |
| GB | 2 337 863 | 12/1999 |
| GB | 2355343 A | 4/2001 |
| JP | 58-081321 | 5/1983 |
| WO | 97/41639 | 11/1997 |
| WO | WO 00/42702 | 7/2000 |
| WO | WO2005/034341 | 4/2005 |

OTHER PUBLICATIONS

D. Trevor Homes & K. Kit Sum, Flat Transformers for Low Voltage, High Current, High Frequency Power Converters, Paper presented at HFPC Power Conversion, PowerSystems World '96., pp. 1-9.

Farid Amalou, et al., Batch-Type Millimeter-Size Transformers for Miniaturized Power Applications, IEEE Transactions on Magnetics, vol. 37, No. 4, Jul. 2001, pp. 2999-3003.

Majid Dadafshar and John Gallagher, Exploiting Integrated Planar Magnetics, Power Electronics Technology, Jan. 2005, pp. 40-48.

Timothy C. Neugebauer and David J. Perreault, Filters With Inductance Cancellation using Printed Circuit Board Transformers, IEEE Transactions On Power Electronics, vol. 19, No. 3 , May 2004, pp. 591-602.

Magnetics, Technical Bulletin FC-S8, Butler, PA, Printed in USA 2001.

Ed Bloom, Magnetics Business & Technology, Planar Power Magnetics, Reprinted from the Aug. 2002 issue of Magnetics Business & Technology, Webcom Communications Corp., 7355 E. Orchard Road, Suite 100, Greenwood Village, CO 80111, USA.

http://www.maxim-ic.com/appnotes.cfm/appnote_number/1760, Class D Audio Amplifiers Save Battery Life, Downloaded Nov. 27, 2005.

Duncan McDonald, Class D audio-power amplifiers: Interactive simulations assess device and filter performance www.ednmag.com, Jan. 4, 2001, pp. 103-110.

Mika Sippola, Developments for the High Frequency Power Transformer Design and Implementation, Helsinki University of Technology Applied Electronics Laboratory, Series E: Electronic Publications E3, Espoo 2003. pp. 1-30.

International Search Report issued on May 30, 2007, in International Application No. PCT/US2006/047221, filed on Dec. 11, 2005.

Njiende, et al. Derivation of Integrated Magnetic Components Using Reluctance and Mathematical Modeling, 2004 35th Annual IEEE Power Electronics Specialists Conference, Aachen, Germany 2004, pp. 4855-4860.

Njiende, et al. Optimization of Inductors in Power Converters Feeding High Power Piezoelectric Motors, May 8, 2003.

Carsten, ITW Paktron, Optimizing Output Filters Using Multilayer Polymer Capacitors in High Power Density Low-Voltage Converters, copyright 2001, Lynchburg, Virginia.

Anderskouv, Niels et al. "High Fidelity Pulse Width Modulation Amplifiers based on Novel Double Loop Feedback Techniques", Audio Engineering Society Preprint. Presented at the 100th Convention Copenhagen. (May 1996).

Anglia. Hybrid choke coil for the suppression of conducted and radiated noise in lighting circuits [online]. Retrieved from the internet on Dec. 19, 2006. http://www.anglia.com/newsarchive/772.asp?article_id=1601.

Boonma, P. et al. "A study of integrated choke characteristic for EMI Filter Design." Retrieved from the internet on Feb. 7, 2007. http://209.85.165.104/search?q=cache:fJi-jG1J4GkJ:www.kmitl.ac.th/emc/vuttipon/My%2520papers/pdf_v17.pdf+A+study+of+integrated+choke&hl=en&ct=clnk&ed=1&gl=us.

Boonma, P. et al. "A New Technique of Integrated EMI Inductor Using Optimizing Inductor-volume Approach." Retrieved from the internet on Feb. 6, 2007. http://209.85.165.104/search?q=cache:pMXF13-d9JQJ:www.kmitl.ac.th/emc/vuttipon/My%2520papers/pdf_v13.pdf+a+new+technique+of+integrated&hl=en&ct=clnk&cd=1&gl=us.

Micromark. Hybrid choke coil combines common mode and differential mode suppression in a single component. (Apr. 19, 2004) Retrieved from the internet on Oct. 25, 2006. http://www.micromark.net/jkcm/default.aspx?pg+Micromark/News%20andPR/PR.

Nielsen, Karsten. "High Fidelity PWM based Amplifier Concept for Active Speaker System with a very Low Energy Consumption", Audio Engineering Society Preprint. Presented at the 100th Convention Copenhagen. (May 1996).

International Search Report and Written Opinion dated May 23, 2008 from International Application No. PCT/US2008/052289.

Prosecution History of U.S. Appl. No. 11/673,325, retrieved from the internet on Jun. 9, 2008.

* cited by examiner

AMPLIFIER OUTPUT FILTER HAVING PLANAR INDUCTOR

BACKGROUND OF THE INVENTION

Fabricating planar inductors on printed circuit boards is a technique that is widely used to create transformers in power supplies. These transformers also include ferromagnetic cores. The ferromagnetic cores generally pass through an aperture in the printed circuit board. The cores can include multiple sections that are joined together.

SUMMARY OF THE INVENTION

In one aspect, the invention is embodied in an output filter for an audio amplifier. The output filter includes a printed circuit board. A plurality of coil windings is formed on one or more layers of the printed circuit board. The filter can also include at least one ferromagnetic plate that is positioned adjacent to the plurality of coil windings. The printed circuit board can embody a multilayer printed circuit board. The plurality of coil windings that are electrically connected through at least one via in the multilayer printed circuit board. The plurality of coil windings can embody an inductor.

In another aspect, the invention is embodied in an output filter for an audio amplifier. The output filter includes at least one aperture extending through the printed circuit board. A first coil winding is formed on a layer of the printed circuit board and substantially surrounds the at least one aperture. A magnetic core includes at least one leg that passes through the at least one aperture.

The printed circuit board can include a multilayer printed circuit board. The printed circuit board can also include a second aperture that extends through the printed circuit board. The magnetic core can also include a second leg that passes through the second aperture. A second coil winding can be formed on a layer of the printed circuit board and can substantially surround the second aperture.

The magnetic core can also include a second leg that passes through the second aperture. The printed circuit board also includes a second aperture and a third aperture that extend through the printed circuit board. The magnetic core can include three legs. At least one of the three legs is gapped. The magnetic core can include a second and a third leg. The second and the third legs pass through the second and the third apertures, respectively.

The output filter can also include a second coil winding formed on a layer of the printed circuit board. The second coil winding substantially surrounds one of the second and the third apertures. The magnetic core can also include a second and a third leg. The second and the third legs pass through the second and the third apertures, respectively.

The first coil winding can include etched copper. A second coil winding can be formed on a layer of the printed circuit board. A via electrically couples the first coil winding to the second coil winding.

The output filter can also include a plurality of coil windings formed on multiple layers of the printed circuit board. Each of the plurality of coil windings is electrically coupled together. The first coil winding can include a helical geometry, a circular spiral pattern, or a rectangular spiral pattern.

The magnetic core can include multiple sections. The multiple sections are coupled together from opposite sides of the printed circuit board. The multiple sections are coupled together using a mechanical clamp or adhesive, for example.

The audio amplifier can embody a switching amplifier. In one embodiment, at least one tank circuit is coupled to the first coil winding. The tank circuit can include at least one inductor and at least one capacitor. The inductor can be formed on at least one layer of the printed circuit board. The inductor can also be a discrete component.

In one embodiment, an inductor for use in an output filter for an amplifier according to the invention includes a printed circuit board and a plurality of coil windings formed on one or more layers of the printed circuit board. The inductor can also include a magnetic core having at least one leg that passes through at least one aperture in the printed circuit board.

In another aspect, the invention is embodied in a method of manufacturing an output filter for an amplifier. The method includes forming a plurality of coil windings on one or more layers of a printed circuit board. The method can further include positioning at least one plate adjacent to the first coil.

The printed circuit board can include a multilayer printed circuit board. The plurality of coils can be connected through at least one via in the multilayer printed circuit board.

In still another aspect, the invention is embodied in a method of manufacturing an output filter for an amplifier. The method includes forming a first aperture through a printed circuit board. A first coil winding is formed on a layer of the printed circuit board. The first coil winding substantially surrounds the first aperture. The method also includes inserting at least one leg of a magnetic core through the first aperture.

The method can also include forming a second aperture through a printed circuit board. A second leg of a magnetic core can be inserted through the second aperture. A second coil winding can be formed on a layer of the printed circuit board. The second coil winding can substantially surround the second aperture. A second leg of a magnetic core can be inserted through the second aperture.

The second coil winding can be coupled to the first coil winding. A plurality of coil windings can be formed on multiple layers of the printed circuit board. The plurality of coil windings formed on the multiple layers of the printed circuit board can be coupled together.

A third aperture can be formed in the printed circuit board. The third aperture can be located between the first and the second apertures. A third leg of the magnetic core can be inserted through the third aperture.

The method can include coupling at least one tank circuit to the first coil winding. The at least one tank circuit can include at least one inductor and at least one capacitor. The at least one inductor can be formed on a layer of the printed circuit board.

BRIEF DESCRIPTION OF THE DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

One advantage of planar magnetics is the fabrication of inductors that are not tall. Printed circuit boards are only as compact as the tallest component on them, and that is often a magnetic component. Additionally, planar designs offer advantages that include low leakage inductance; excellent repeatability of performance; economical assembly; mechanical integrity; and very good thermal characteristics. Other advantages include integrated terminations including access to taps within the winding structure. This allows realization of much more complex filters than can economically be fabricated with conventional wound structures.

An output filter for an audio switching amplifier according to an embodiment of the invention includes a planar inductor that is fabricated on a printed circuit board or a substrate. The planer inductor is fabricated by forming a continuous spiral planar winding having inner and outer ends that define two terminals of the planar inductor. The printed circuit board can include a multiple layer printed circuit board. The coil winding of the inductor can be formed on different layers of the printed circuit board. The printed circuit board can also include one or more apertures that can be formed in the printed circuit board. A ferrite core can be inserted into one or more of the apertures.

Figure 1:
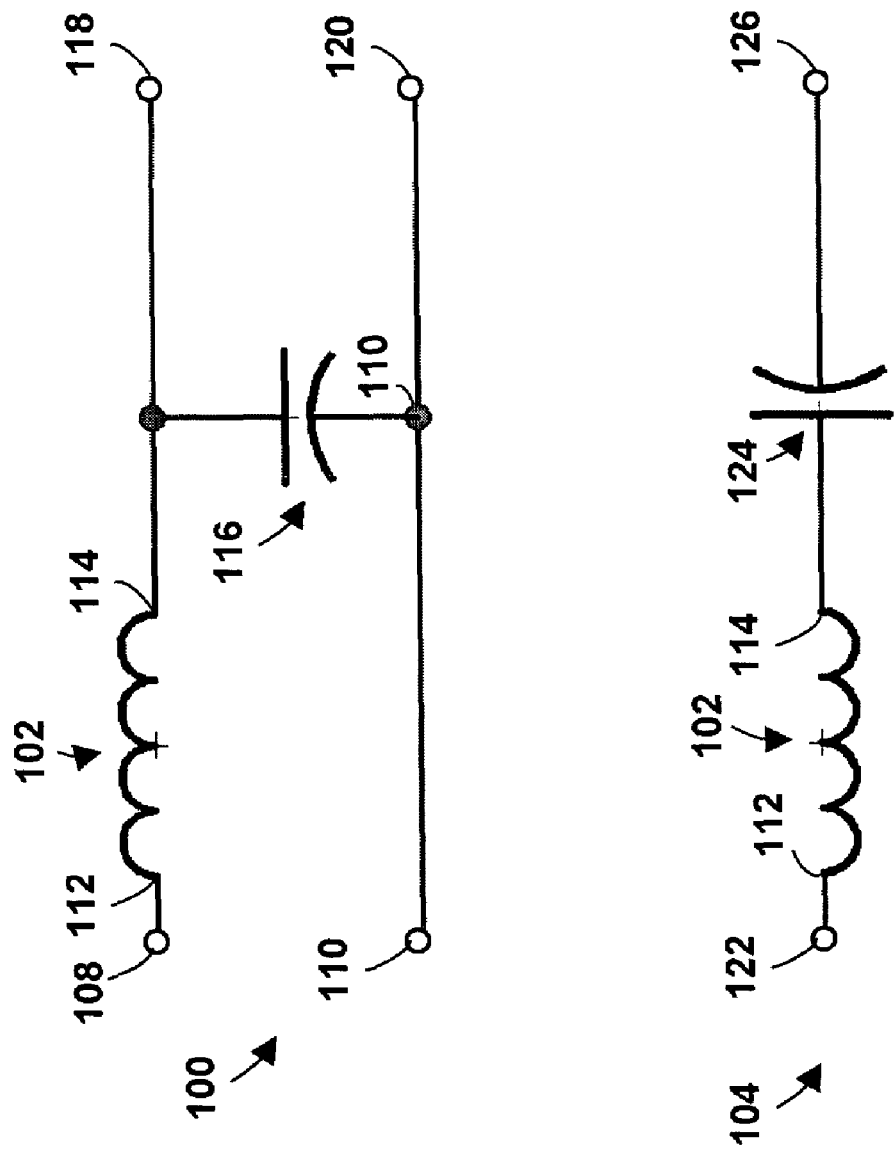
FIG. 1 is a representative diagram of a low pass filter and a series resonant network for use with an amplifier.

FIG. 1 is a representative diagram of a low pass filter 100 and a series resonant network 104 for use with an amplifier (not shown). The low pass filter 100 can include two terminals 108, 110 representing the input of the filter 100. The low pass filter 100 includes an inductor 102 having a first end 112 and a second end 114. A capacitor 116 is coupled between the second end 114 of the inductor 102 and the second terminal 110. The output of the low pass filter 100 is represented by two terminals 118, 120. The low pass filter 100 can be used to pass frequencies of interest while filtering out the switching frequency, its harmonics, and high frequency noise, for example.

The series resonant filter 104, sometimes referred to as a tank circuit, includes a terminal 122 representing the input of the filter 104 which can be coupled to an amplifier output. The series resonant filter 104 includes the inductor 102 having the first end 112 and the second end 114. A capacitor 124 is coupled to the second end 114 of the inductor 102. A second end 126 of the series resonant filter 104 is typically coupled to ground. Different combinations of bandpass filters, low pass filters, and/or resonant filters can be used. In other embodiments, resistors can also be used in filter designs according to the invention.

In general, a tank circuit allows selective filtering of a switching frequency and some of its harmonics. One characteristic of a tank circuit according to the invention is that it can be designed to filter out a relatively wide band of frequencies (significant reduction over much of the AM band).

For example, output filters according to the invention can be used with amplifiers that reproduce frequencies from DC to 100 kHz. More specifically, the amplifier can reproduce frequencies between 0.01 Hz to 100 kHz. In one embodiment, the amplifier reproduces frequencies that can be heard by the human ear (i.e., between about 20 Hz to about 20 kHz). The output power of the amplifier can be between about 1 W to 1 kW. The load impedance can be between about 0.1Ω to about 100Ω.

Figure 2A:
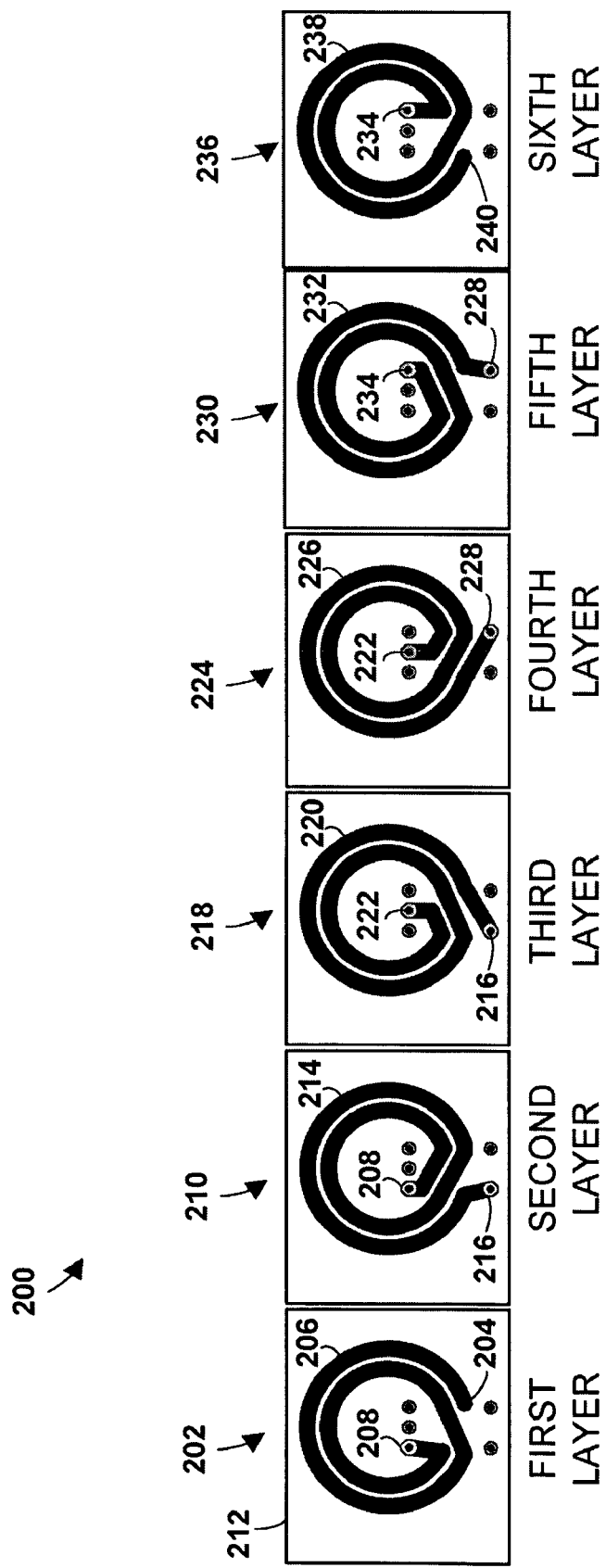
FIG. 2A illustrates an inductor fabricated on a multiple layer printed circuit board according to one embodiment of the invention.

FIG. 2A illustrates an inductor 200 fabricated on a multiple layer printed circuit board according to one embodiment of the invention. The multiple layer printed circuit board includes six layers. The layers actually lay on top of each other, but are shown next to each other for illustrative purposes. A first layer 202 can include a first terminal 204, a spiral winding 206 and a first via 208. The term "via" as used herein denotes a metalized through hole that couples one layer of a printed circuit to another layer. The first via 208 is used to interconnect the first layer 202 with a second layer 210. Using known techniques not described in detail herein, the spiral winding 206 can be formed either by chemically etching a layer of electrically conducting material, such as copper, deposited on the face of a circuit board 212, or by depositing electrically conducting material on the face of the circuit board 212. The spiral winding 206 can be circular, helical, rectangular, or any other suitable shape.

The second layer 210 can include the first via 208, a spiral winding 214, and a second via 216. The second via 216 is used to interconnect the second layer 210 with a third layer 218. The third layer 218 can include the second via 216, a spiral winding 220, and a third via 222. The third via 222 is used to interconnect the third layer 218 with a fourth layer 224. The fourth layer 224 can include the third via 222, a spiral winding 226, and a fourth via 228. The fourth via 228 is used to interconnect the fourth layer 224 with a fifth layer 230. The fifth layer 230 can include the fourth via 228, a spiral winding 232, and a fifth via 234. The fifth via 234 is used to interconnect the fifth layer 230 with a sixth layer 236. The sixth layer 236 can include the fifth via 234, a spiral winding 238, and a second terminal 240. The first terminal 204 of the first layer 202 of the inductor 200 and the second terminal 240 of the sixth layer 236 of the inductor 200 correspond to the first 112 and the second ends 114 of the inductor 100 of FIG. 1.

In one embodiment, one or more of the vias 208, 216, 222, 228, and 234 can be used as a coil tap. One or more other taps can be easily be added to the planar coils as desired. For example, a coil tap can be formed from a trace that originates from a planar winding. Tapped inductors can be utilized with various filter topologies as described herein.

Figure 2B:
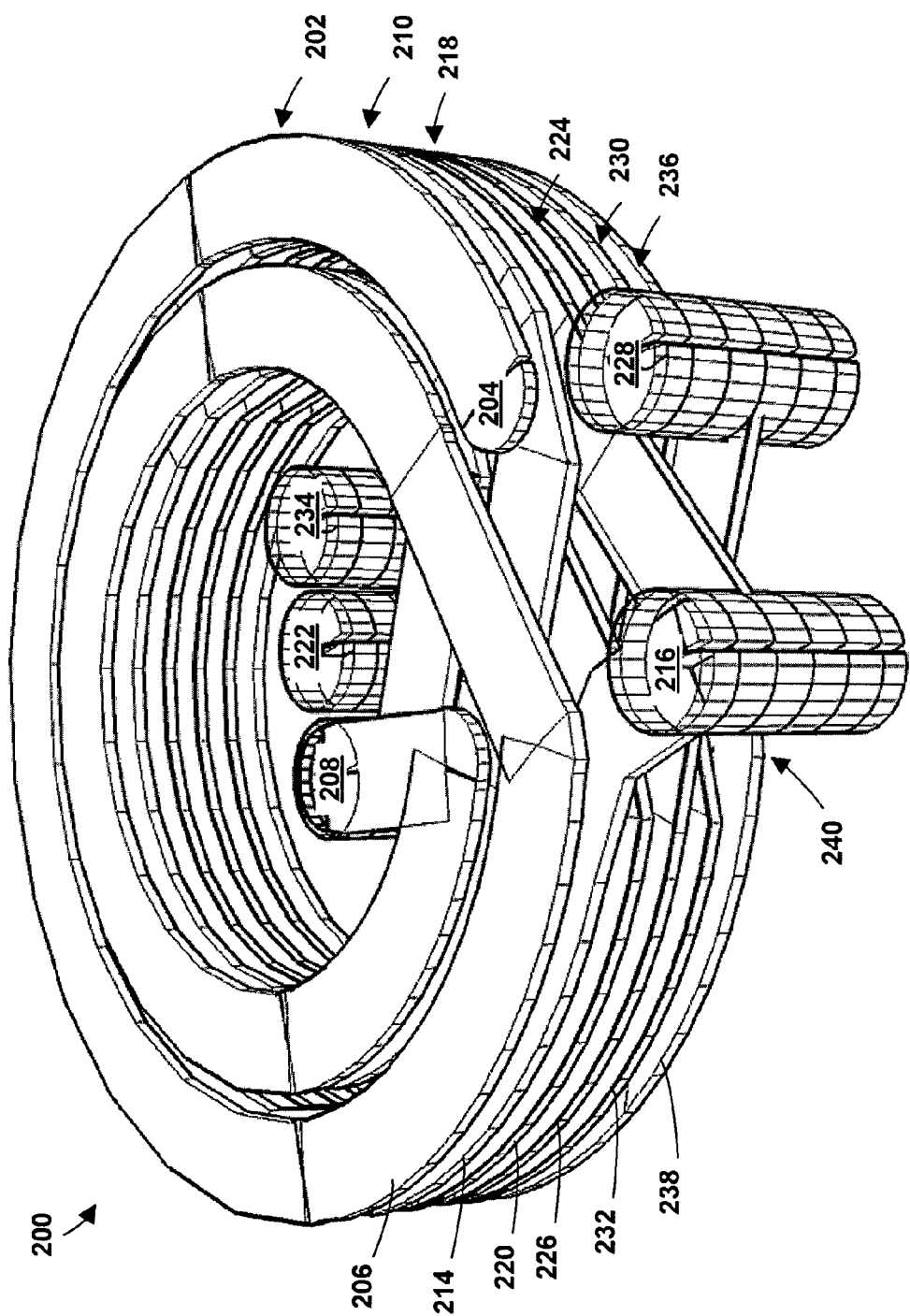
FIG. 2B illustrates a perspective view of the inductor of FIG. 2A.

FIG. 2B illustrates a perspective view of the inductor 200 of FIG. 2A. The first terminal 204 of the first layer 202 is shown adjacent to the fourth via 228. In practice, the first terminal 204 can be formed in any desired location. The second terminal 240 of the sixth layer 236 is located behind the second via 216. In practice, the second terminal 240 can be formed in any desired location.

As shown in FIG. 2B, each of the spiral windings 206, 214, 220, 226, 232, and 238 can be coaxial with respect to each other. Additionally, the vias 208, 216, 222, 228, and 234 connect the spiral windings 206, 214, 220, 226, 232, and 238 in series thereby forming a continuous spiral winding. In one embodiment, electrical current flows through each of the spiral windings 206, 214, 220, 226, 232, and 238 in the same direction.

The number of windings of an inductor is related to the amount of current flow that the inductor can carry as well as the amount of heat produced by that current. Additionally, the number of windings affects the inductance. For example, the inductance is proportional to $n^2$, where n is the number of windings of the inductor. The resistance of an inductor increases as the number of windings n increases:

$$r = n \times r_w$$

where $r_w$ is the resistance of a single winding and r is the total resistance of the inductor. Additionally, resistance varies inversely with the cross section of each winding. Thus, the larger the cross section of the winding, the lower the resistance in the winding.

In FIG. 2B there are two windings per layer for a total of twelve windings. The structure in FIG. 2B could also have been fabricated with one winding per layer, for a total of six windings. In the latter case, each winding would have had roughly half the resistance (twice the cross section, half the resistance). Thus, the relationship between the two structures (six layers, two turns per layer versus six layers, one turn per layer) can be expressed as:

$$r_2 = 12 \times r_{w2}$$

where $r_{w2}$ is the resistance of each winding in the two winding per layer structure and $r_2$ is the resistance of the entire two winding per layer structure. We can likewise solve for $r_1$ (the resistance of the one winding per layer structure):

$$r_1 = 6 \times \frac{r_{w2}}{2} = \frac{r_2}{4}.$$

Likewise, the relationship between the current in each structure can be expressed as:

$$I_1 = \frac{I_2}{4}.$$

Figure 2C:
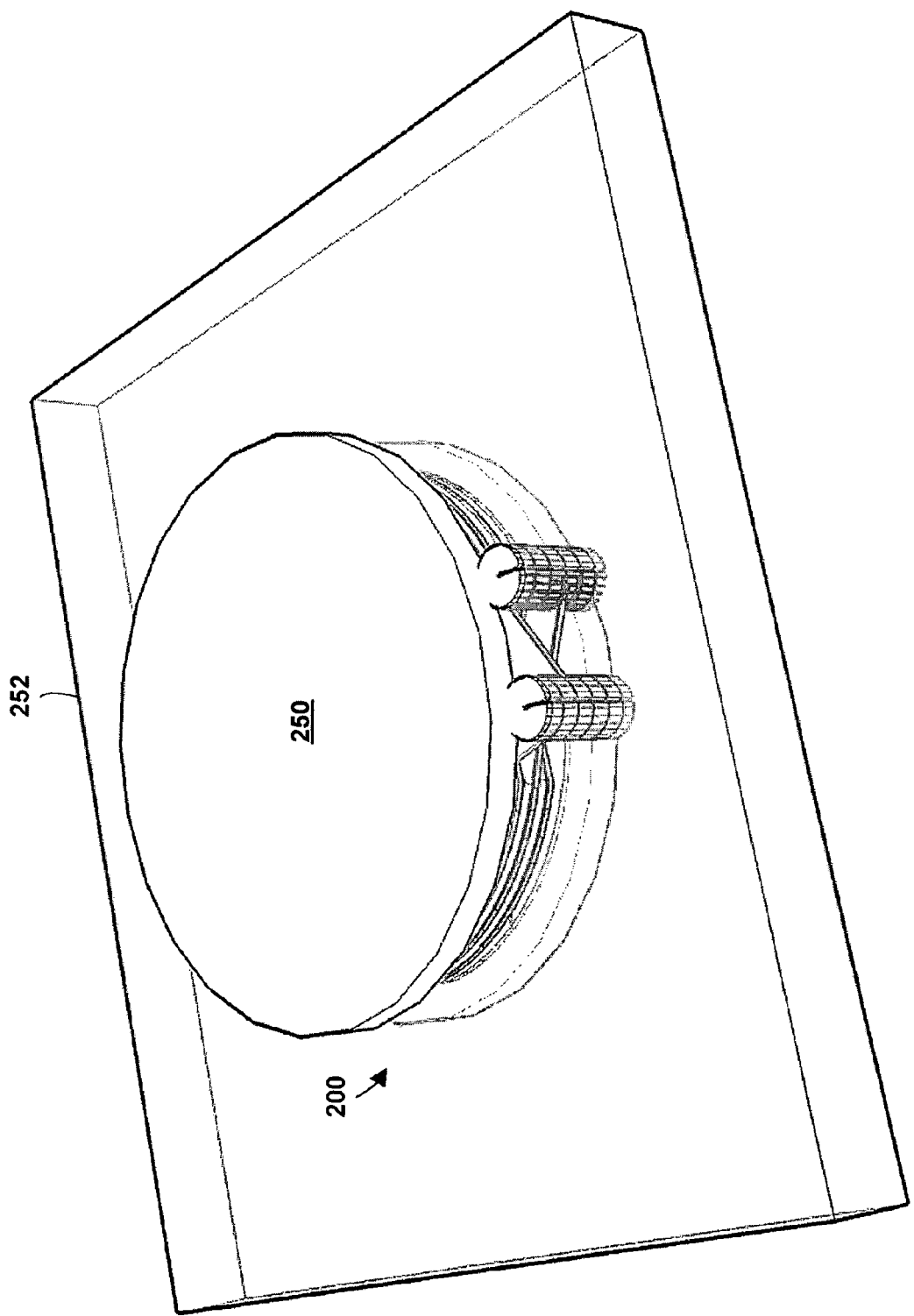
FIG. 2C illustrates a perspective view of the inductor of FIG. 2A including a ferrite plate positioned above the inductor.

FIG. 2C illustrates a perspective view of the inductor 200 of FIG. 2A including a ferrite plate 250 positioned above the inductor 200. Also shown for illustration is a multilayer printed circuit board 252. Although embodiments of the invention are shown using multilayer printed circuit boards, other circuit boards could also be used. For example, an inductor according to the invention can be fabricated using individually stacked printed circuit boards, a multilayer printed circuit board containing only the planar windings that is later assembled to a main board, or an integrated circuit board containing the planar windings as well as additional circuitry.

One function of the ferrite plate 250 is to confine the magnetic flux generated by the current passing through the inductor 200. At frequencies of interest, the confinement of the magnetic flux can increase the inductance of the inductor 200. An inductor of a given value and current capacity can generally be designed to be significantly smaller by utilizing a ferromagnetic core. The ferrite plate 250 can be attached to the printed circuit board 252 using various techniques. For example, the ferrite plate 250 can be attached to the printed circuit board 252 using glue, tape, one or more mechanical clips, or other hardware.

Figure 3:
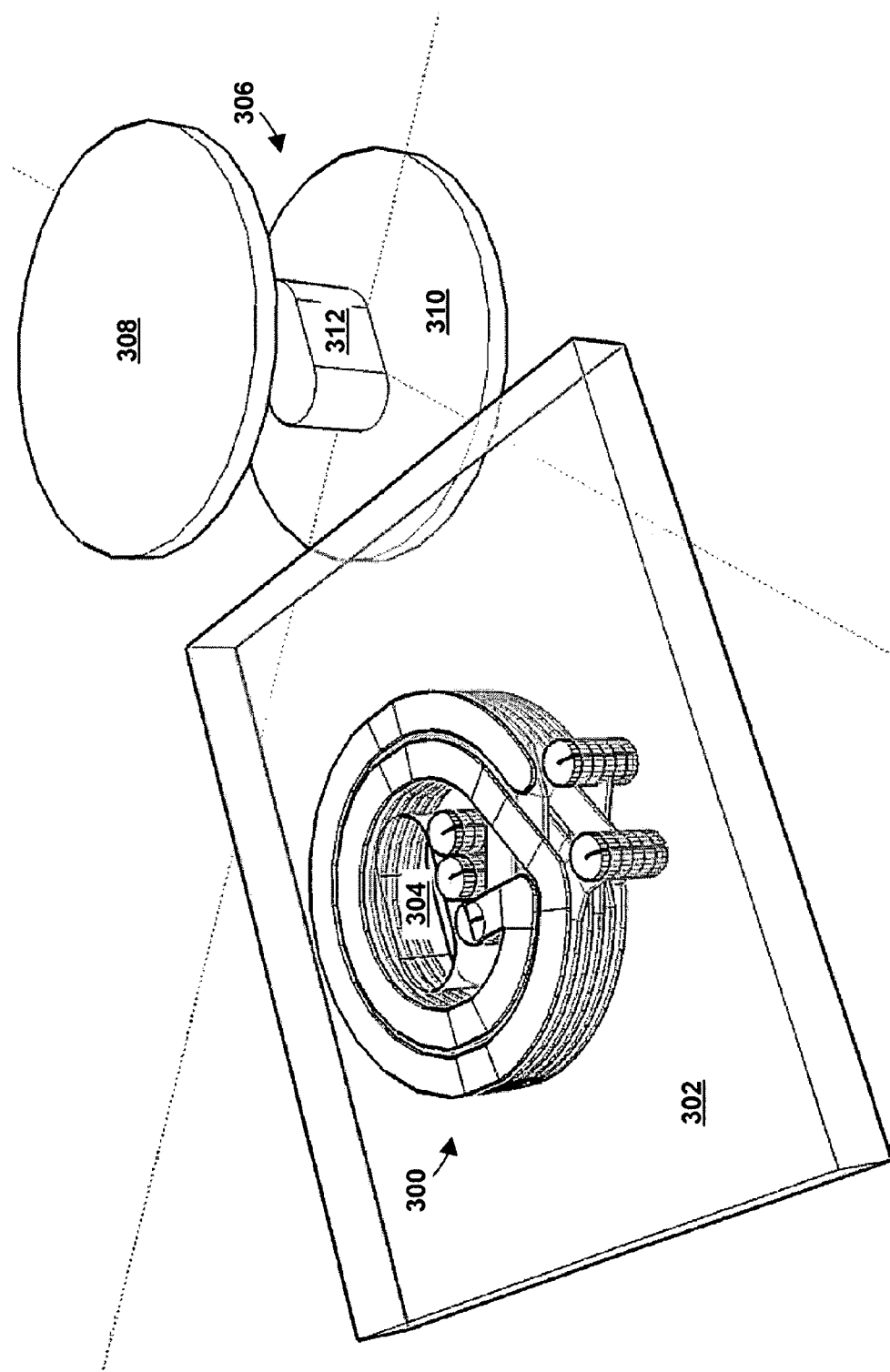
FIG. 3 illustrates a perspective view of an inductor fabricated on a multiple layer printed circuit board including an aperture and a ferrite core in a disassembled state.

FIG. 3 illustrates a perspective view of an inductor 300 fabricated on a multiple layer printed circuit board 302 including an aperture 304 and a ferrite core 306 in a disassembled state. The ferrite core 306 can include a top section 308 and a bottom section 310. The top section 308 and the bottom section 310 are assembled together such that a portion 312 of the bottom section 310 is positioned inside the aperture 304.

There are several techniques that can be used to assemble the ferrite core 306. For example, a mechanical clip (not shown) can be used to hold the top section 308 and the bottom section 310 together. The top section 308 and the bottom section 310 can sometimes include slots to receive the mechanical clip. The slots prevent the mechanical clip from adding additional height to the assembly and prevent the top section 308 and the bottom section 310 from moving laterally. Alternatively, tape can be used to assemble the ferrite core 306. In one embodiment, a high temperature adhesive is used to assemble the ferrite core 306.

Figure 4A:
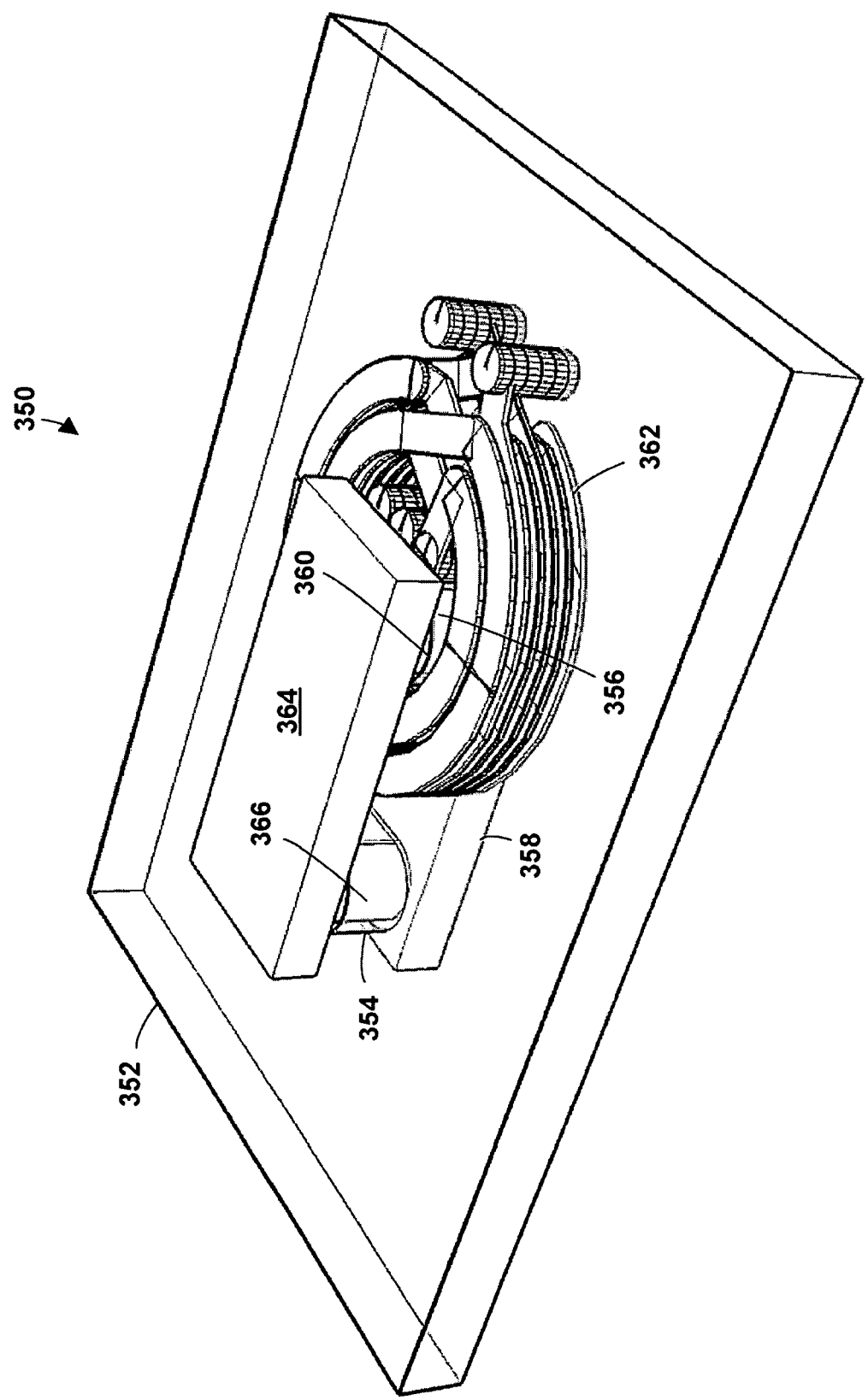
FIG. 4A illustrates perspective view of an inductor fabricated on a multiple layer printed circuit board including two apertures and a U-shaped ferrite core.

FIG. 4A illustrates perspective view of an inductor 350 fabricated on a multiple layer printed circuit board 352 including two apertures 354, 356 and a U-shaped ferrite core 358. The U-shaped core 358 includes a first leg 360. The first leg 360 of the core 358 can be surrounded by a first planar coil 362. A top plate 364 is mechanically coupled to the U-shaped core 358.

In one embodiment (not shown), a second planar coil can surround a second leg 366 of the core 358. In this embodiment, the polarity of the planar coil windings must be considered. For example, if the coils have identical windings, there are two ways of arranging them on a printed circuit board. The coils can be wound with any desired polarity. The polarity of the coils can affect the magnetic field and the inductance in the coils.

One important dimension related to the U-shaped core 358 is referred to as the core gap. The gap is configured to maintain a predictable inductance as well as to prevent core saturation over a desired range of currents and temperatures. In one embodiment, the core gap is set shallow enough so there is enough inductance to hold ripple current to an acceptable level, but deep enough so that the ferrite core does not saturate under maximum current load. The core gap can be determined through an iterative process in which the core gap is adjusted as the number of turns of the planar coil are varied. The core gap can vary with different embodiments of the inductor. The gap and turns design affect not only the inductance and resistance of the structure, but also the DC current it can sustain without saturation, and the AC loss.

Figure 4B:
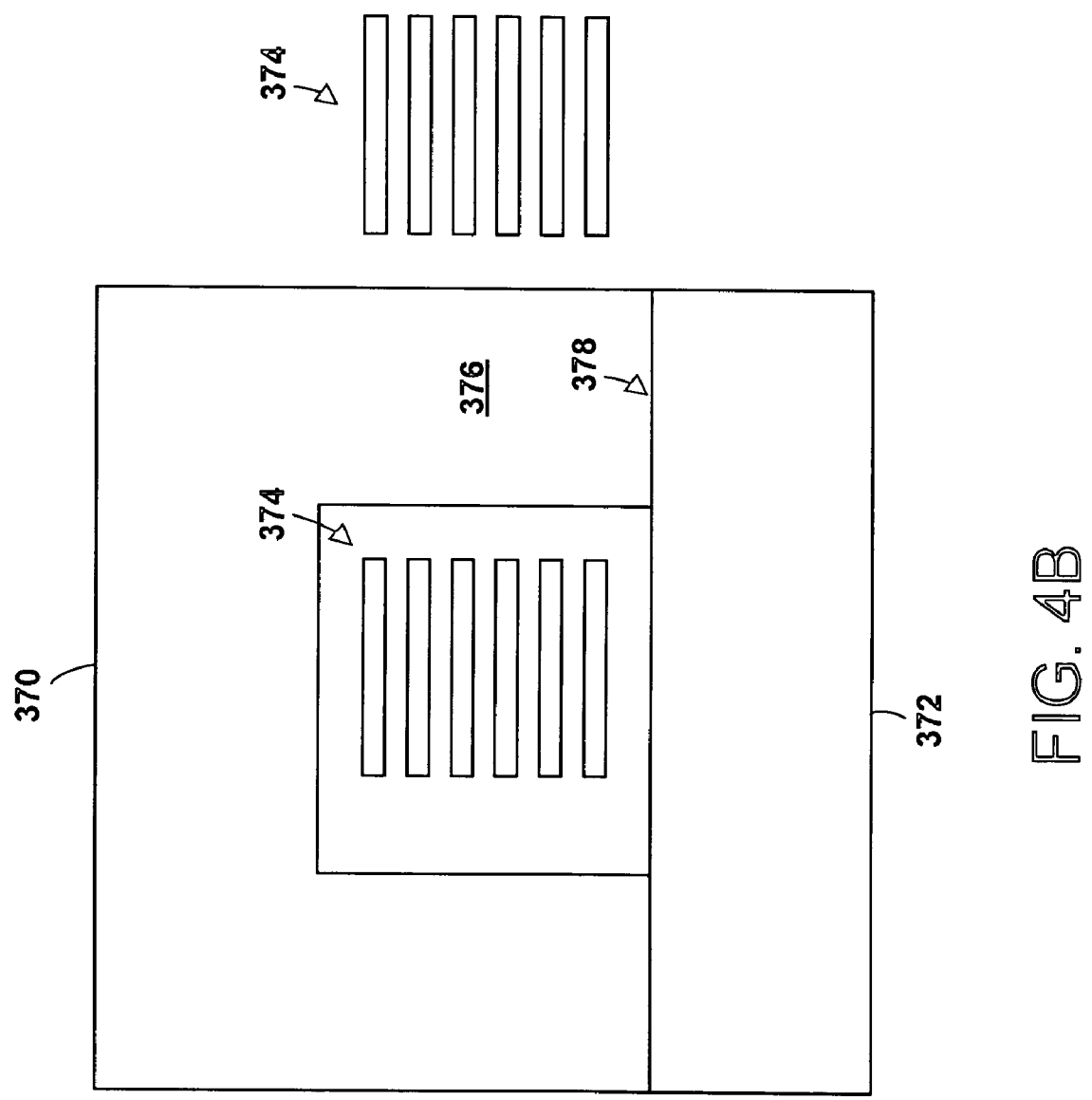
FIG. 4B illustrates a side view of an ungapped U-shaped ferrite core that can be used in the inductor of FIG. 4A.

FIG. 4B illustrates a side view of an ungapped U-shaped core 370 that can be used in the inductor 350 of FIG. 4A. The U-shaped core 370 can be coupled to an I-shaped core 372. Windings 374 are configured to surround a first leg 376 of the U-shaped core 370. In this embodiment, no gap exists at an interface 378 between the first leg 376 of the U-shaped core 370 and the I-shaped core 372.

Figure 4C:
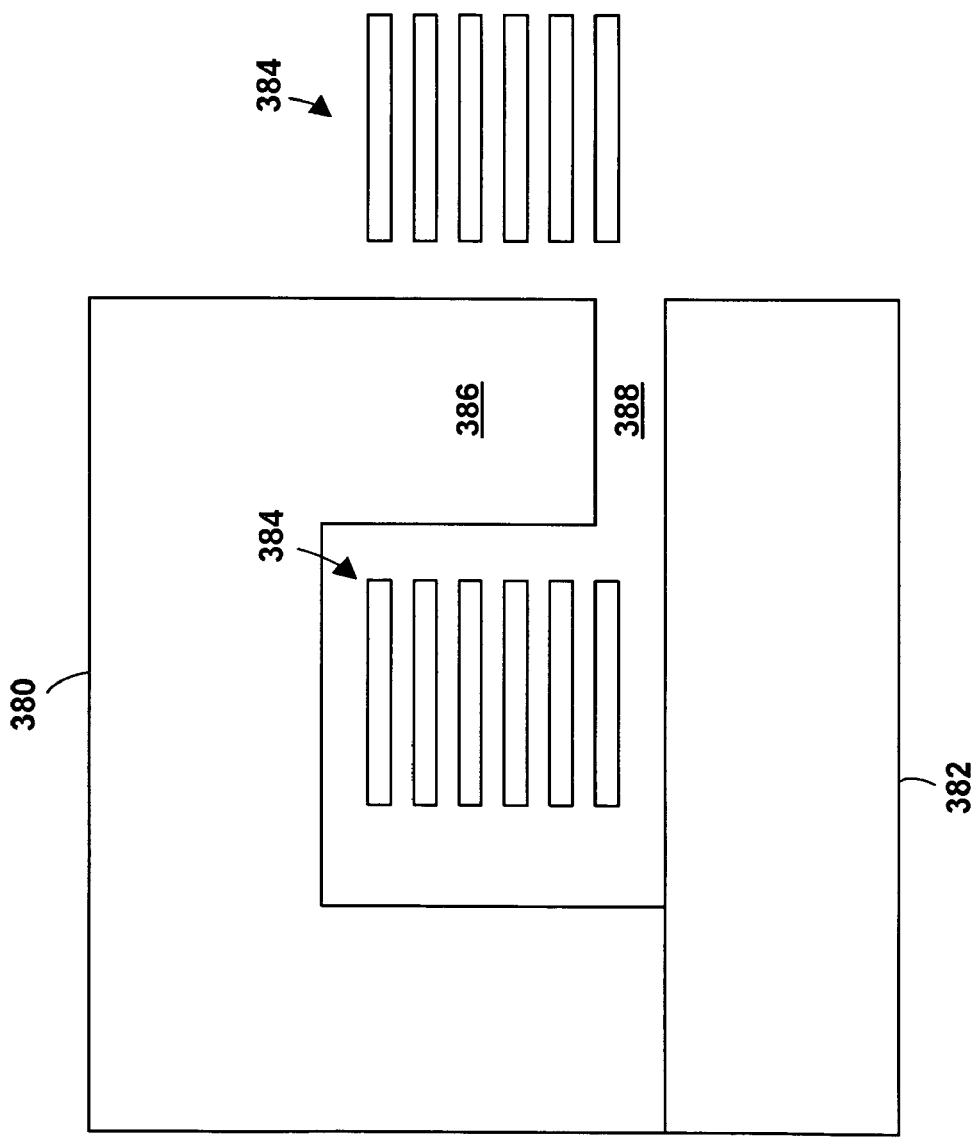
FIG. 4C illustrates a side view of a gapped U-shaped ferrite core that can be used in the inductor of FIG. 4A.

FIG. 4C illustrates a side view of a gapped U-shaped core 380 that can be used in the inductor 350 of FIG. 4A. The U-shaped core 380 can be coupled to an I-shaped core 382. Windings 384 are configured to substantially surround a first leg 386 of the U-shaped core 380. In this embodiment, a gap 388 exists between the first leg 386 of the U-shaped core 380 and the I-shaped core 382.

Figure 4D:
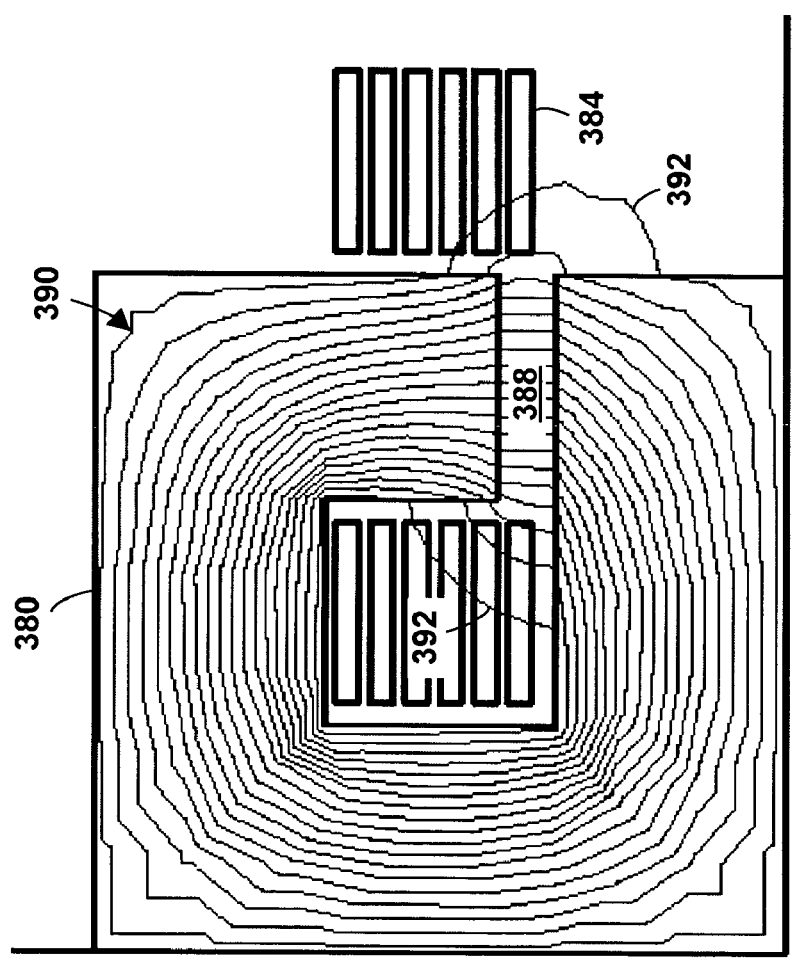
FIG. 4D illustrates magnetic flux lines in the gapped U-shaped ferrite core of FIG. 4C.

FIG. 4D illustrates magnetic flux lines 390 in the gapped U-shaped core 380 of FIG. 4C. The magnetic flux lines 390 behave as expected around the actual core material. The gap 388 causes a number of flux lines 392 to fringe or bow out and cross into the windings 384.

Figure 5:
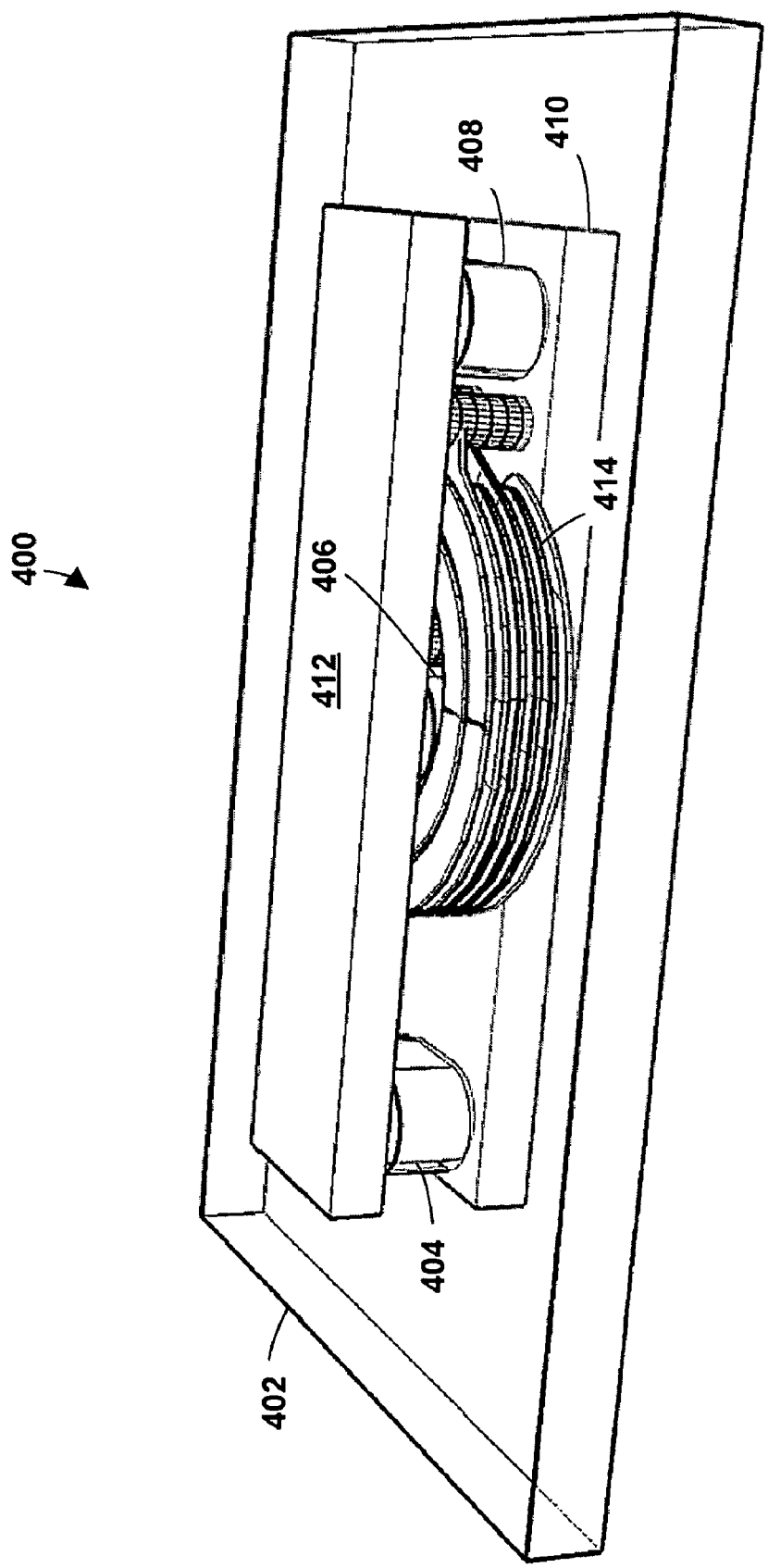
FIG. 5 illustrates perspective view of an inductor fabricated on a multiple layer printed circuit board including three apertures and an E-shaped ferrite core.

FIG. 5 illustrates perspective view of an inductor 400 fabricated on a multiple layer printed circuit board 402 including three apertures 404, 406, 408, and an E-shaped ferrite core 410. A top plate 412 is mechanically coupled to the E-shaped core 410. As previously described, the top plate 412 can be coupled to the E-shaped core 410 using various techniques, such as adhesive or a mechanical clip, for example.

In the embodiment shown, a planar coil 414 surrounds the center leg of the E-shaped core 410. In another embodiment shown in FIG. 7, a single coil can surround each of the outer legs of the E-shaped core 410. One advantage of the E-shaped core 410 is that it includes two magnetic current paths through the E-shaped core 410.

Figure 6:
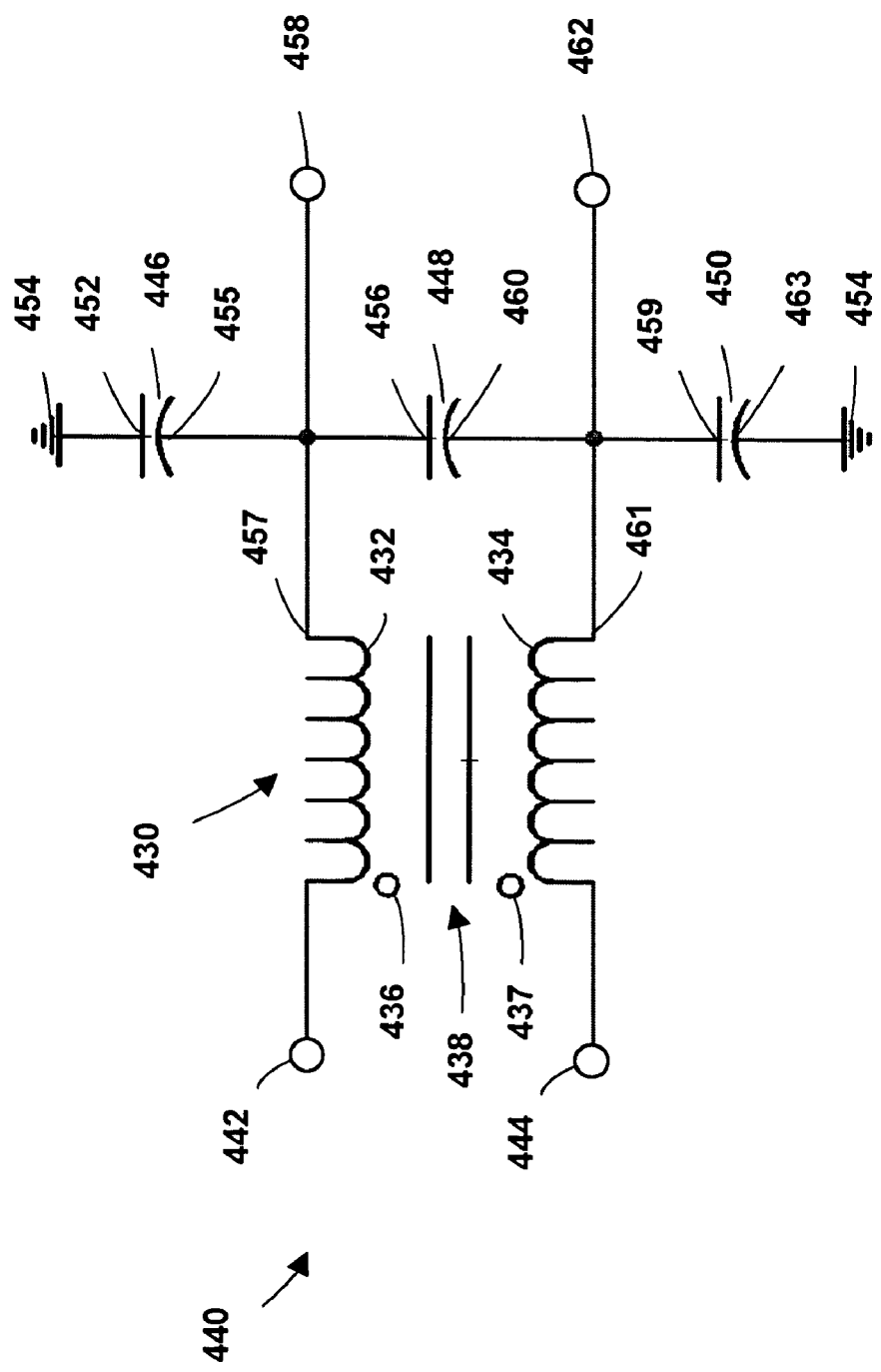
FIG. 6 is a schematic illustration of an H-bridge output filter including a dual inductor for an amplifier.

FIG. 6 is a schematic illustration of an H-bridge output filter 440 including a dual inductor 430 for an amplifier. For example, the amplifier can be a bridge-tied load (btl) amplifier. The dual inductor 430 is represented by a first coil 432 and a second coil 434. The polarity of each of the coils 432, 434 is represented by two small circles 436, 437. The horizontal lines 438 indicate that the individual coils 432, 434 are magnetically coupled.

The H-bridge output filter 440 includes the dual inductor 430. Input terminals 442, 444 of the H-bridge output filter 440 are connected to output terminals of the amplifier (not shown). The filter 440 also includes capacitors 446, 448, 450. A first terminal 452 of the first capacitor 446 is coupled to ground 454. A second terminal 455 of the first capacitor 446, a first terminal 456 of the second capacitor 448, and an output 457 of the first coil 432 of the inductor 430 are coupled to a first output terminal 458. A first terminal 459 of the third capacitor 450, a second terminal 460 of the second capacitor 448, and an output 461 of the second coil 434 of the inductor 430 are coupled to a second output terminal 462. A second terminal 463 of the third capacitor 450 is also coupled to ground 454. The output terminals 458, 462 of the filter 440 are coupled to a load (not shown).

Skilled artisans will appreciate that various filter designs can be used according to the invention. For example, the invention can embody a Bessel filter, a Chebyshev filter, or a Butterworth filter.

Figure 7:
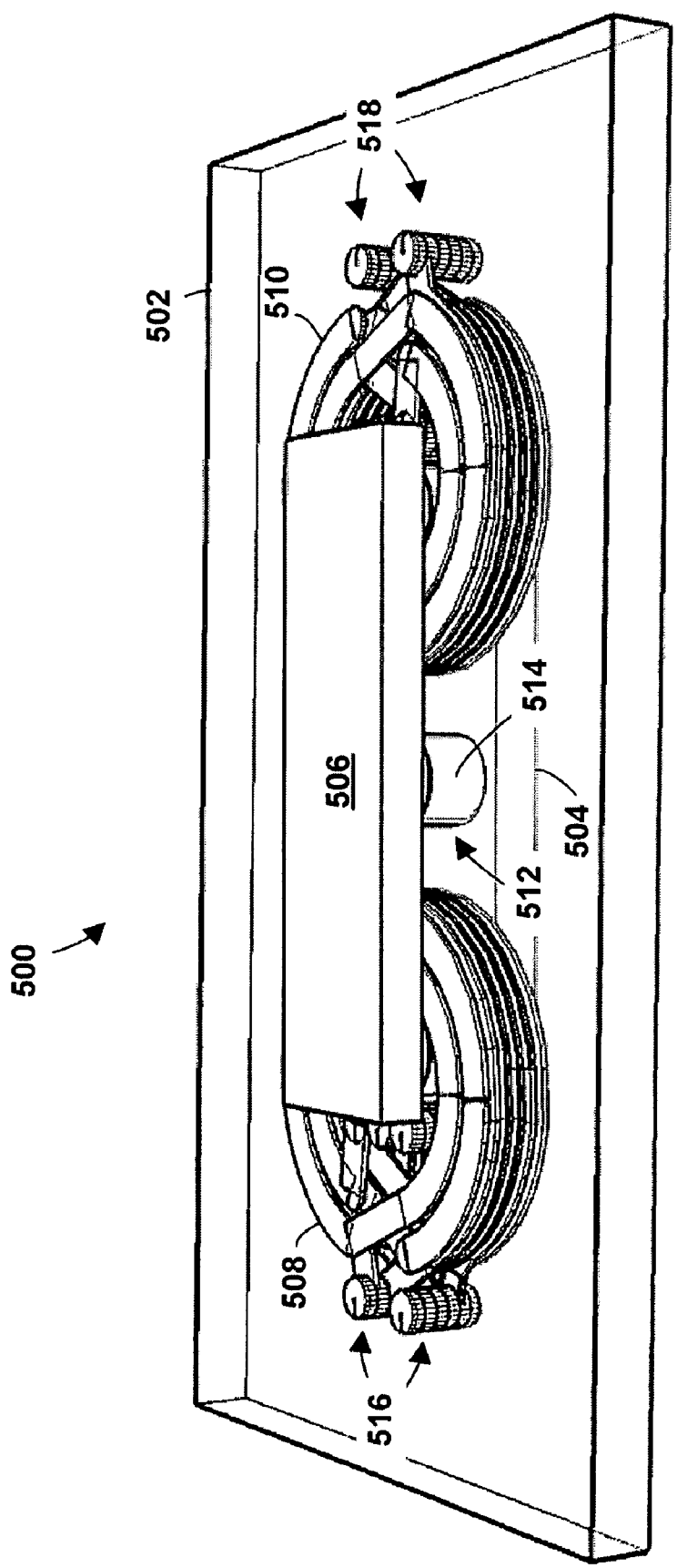
FIG. 7 illustrates perspective view of a dual inductor fabricated on a multiple layer printed circuit board including three apertures and an E-shaped ferrite core.

FIG. 7 illustrates perspective view of a dual inductor 500 fabricated on a multiple layer printed circuit board 502 including three apertures and an E-shaped ferrite core 504. A top plate 506 is mechanically coupled to the E-shaped core 504. The dual inductor 500 includes a first coil winding 508 and a second coil winding 510. As previously described, the gap 512 in the center leg 514 free of a coil winding of the core 504 controls the leakage inductance.

In the topology illustrated in FIG. 7, the common mode inductance is independent of the gap 512, and the differential inductance is controlled by the gap 512. The magnetic field resulting from the load current is stored in the gap 512, and senses the differential inductance. The common mode inductance is not affected by the load current. This allows a much higher common mode inductance with resulting decrease in common mode noise transmission.

A first set of vias 516 is associated with the first coil winding 508. A second set of vias 518 is associated with the second coil winding 510. The first 516 and second set of vias 518 are easily accessible and can be used as taps from the respective coils 508, 510. Additionally, as previously described, a tap can also be fabricated from a trace that is coupled to a planar coil.

Figure 8:
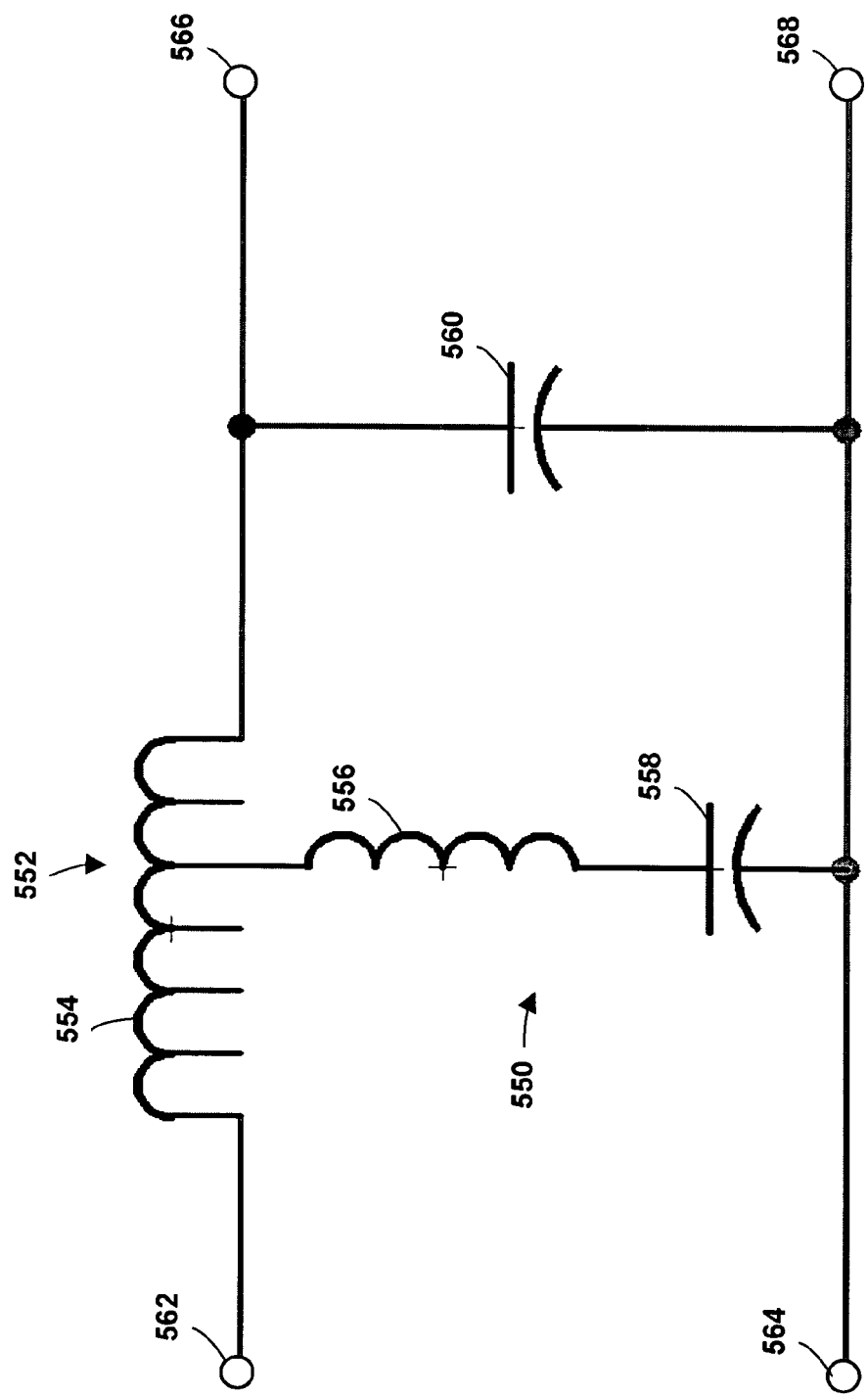
FIG. 8 is a schematic illustration of series resonant circuit connected to a tap on a single inductor.

FIG. 8 is a schematic illustration of series resonant circuit 550 connected to a tap 552 on a single inductor 554. As previously described, the planar inductor 554 can be fabricated on a printed circuit board to include the tap 552. The tap 552 can be accessed through a via in the printed circuit board, such as the via 516 shown in FIG. 7. The series resonant circuit 550 is sometimes referred to as a tank circuit. The series resonant circuit 550 includes an inductor 556 and a capacitor 558. Another capacitor 560 is connected in parallel to the series resonant circuit 550.

A first input terminal 562 and a second input terminal 564 are coupled to output terminals of an amplifier (not shown). A first output terminal 566 and a second output terminal 568 are coupled to a load (not shown).

Figure 9:
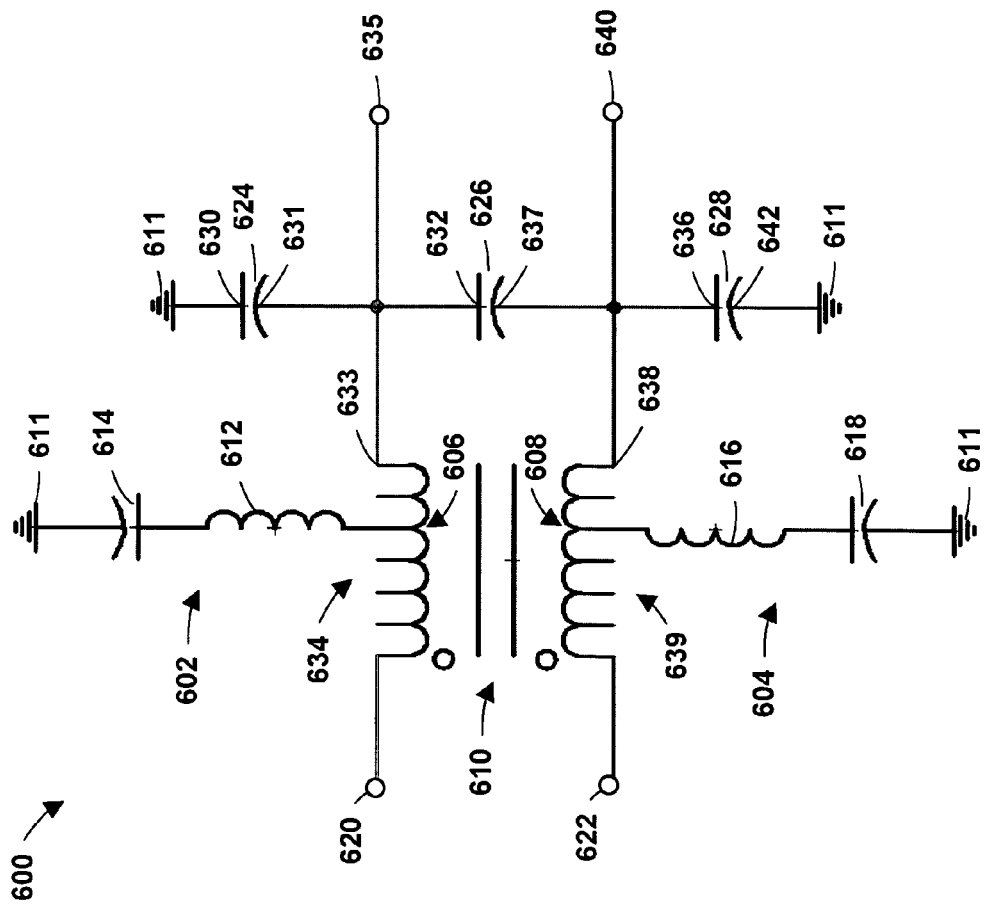
FIG. 9 is a schematic illustration of an H-bridge output filter having a first and a second series resonant circuit connected to a first and a second tap on a dual inductor.

FIG. 9 is a schematic illustration of an H-bridge output filter 600 having a first 602 and a second series resonant circuit 604 connected to a first 606 and a second tap 608 on a dual inductor 610. The first 602 and the second series resonant circuits 604 are connected to ground 611. As previously described, a series resonant circuit or tank circuit allows selective filtering of a switching frequency and some of its harmonics. When these tank circuits are connected to a tapped inductor, their response is modified giving the designer much more control of filter behavior than with a simple tank circuit alone.

The first resonant circuit 602 includes an inductor 612 and a capacitor 614. The second resonant circuit 604 includes an inductor 616 and a capacitor 618. In one embodiment, the inductors 612, 616 in each of the first 602 and the second resonant circuits 604 are identical. In one embodiment, the capacitors 614, 618 in each of the first 602 and the second resonant circuits 604 are also identical. In other embodiments, the inductors 612, 616 and/or the capacitors 614, 618 are not identical.

The H-bridge output filter 600 includes input terminals 620, 622 that are connected to output terminals of an amplifier (not shown). The H-bridge output filter 600 also includes capacitors 624, 626, 628. A first terminal 630 of the first capacitor 624 is coupled to ground 611. A second terminal 631 of the first capacitor 624, a first terminal 632 of the second capacitor 626, and an output 633 of a first coil 634 of the inductor 610 are coupled to a first output terminal 635. A first terminal 636 of the third capacitor 628, a second terminal 637 of the second capacitor 626, and an output 638 of a second coil 639 of the inductor 610 are coupled to a second output terminal 640. A second terminal 642 of the third capacitor 628 is also coupled to ground 611. The output terminals 635, 640 of the H-bridge output filter 600 are coupled to a load (not shown). Skilled artisans will appreciate that various filter topologies can be used without departing from the invention.

Figure 10:
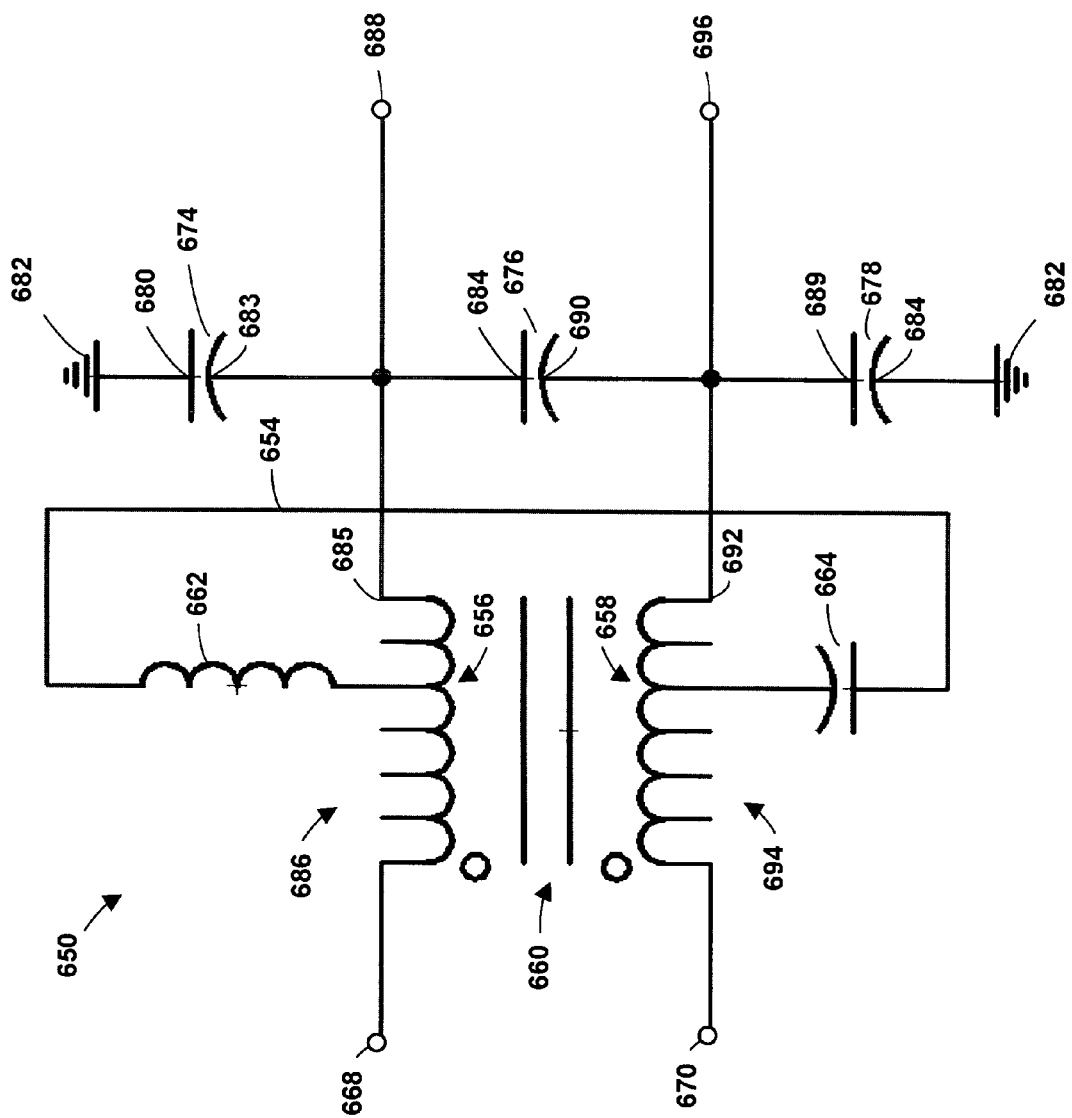
FIG. 10 is a schematic illustration of an H-bridge output filter having a series resonant circuit connected to a first and a second tap on a dual inductor.

FIG. 10 is a schematic illustration of an H-bridge output filter 650 having a series resonant circuit 654 connected to a first 656 and a second tap 658 on a dual inductor 660. The series resonant circuit 654 includes an inductor 662 and a capacitor 664.

The H-bridge output filter 650 also includes input terminals 668, 670 that are connected to output terminals of an amplifier (not shown). The H-bridge output filter 650 also includes capacitors 674, 676, 678. A first terminal 680 of the first capacitor 674 is coupled to ground 682. A second terminal 683 of the first capacitor 674, a first terminal 684 of the second capacitor 676, and an output 685 of a first coil 686 of the inductor 610 are coupled to a first output terminal 688. A first terminal 689 of the third capacitor 678, a second terminal 690 of the second capacitor 676, and an output 692 of a second coil 694 of the inductor 660 are coupled to a second output terminal 696. A second terminal 684 of the third capacitor 678 is also coupled to ground 682. The output terminals 688, 696 of the H-bridge output filter 650 are coupled to a load (not shown).

Figure 11:
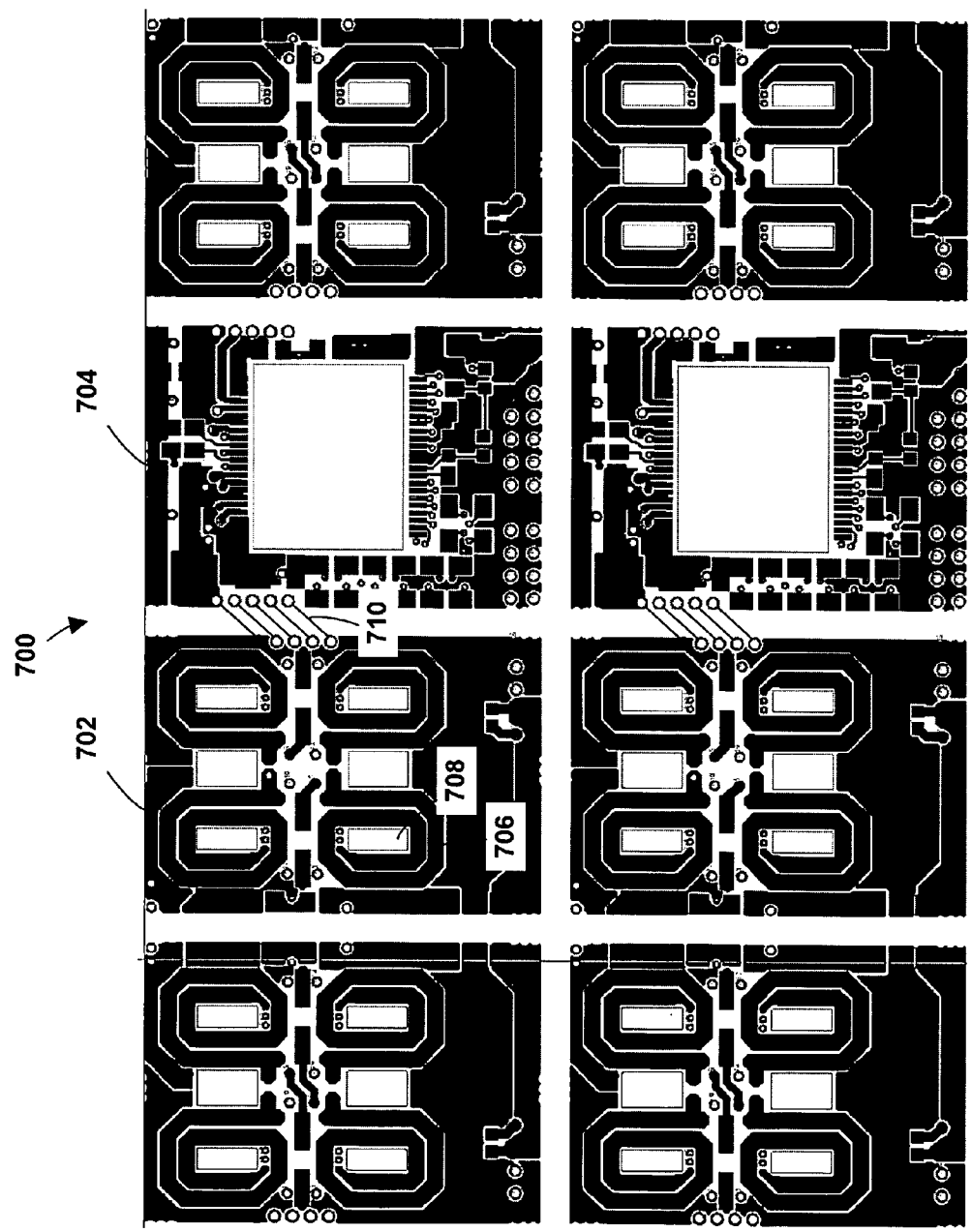
FIG. 11 is an illustrative diagram of a printed circuit board layout according to the invention.

FIG. 11 is an illustrative diagram of a printed circuit board layout 700 according to the invention. Specifically, the layout 700 illustrates panelization and the integration of planar structures 702 with integrated circuits 704. The coil structures 706 surround apertures 708 that can be configured to accept E-shaped cores. Jumpers 710 are used to connect the planar structures 702 to the integrated circuits 704. In one embodiment, the jumpers 710 allow the board having the planar structures 702 to be folded relative to the board having the integrated circuits 704. In another embodiment, the planar structures 702 can be located on the same board as the integrated circuits 704.

While the invention has been particularly shown and described with reference to specific exemplary embodiments, it is evident that those skilled in the art may now make numerous modifications of, departures from and uses of the specific apparatus and techniques herein disclosed. Consequently, the invention is to be construed as embracing each and every novel feature and novel combination of features presented in or possessed by the apparatus and techniques herein disclosed and limited only by the spirit and scope of the appended claims.

What is claimed is:

1. An output filter for an audio amplifier comprising:
   a printed circuit board having a first aperture, a second aperture, and a third aperture, the first, second, and third apertures extending through the printed circuit board;
   a first coil winding formed on a layer of the printed circuit board and substantially surrounding the first aperture;
   a tank circuit comprising an inductor and a capacitor and coupled to a tap on the first coil winding at a point other than at an end of the first coil winding;
   a second coil winding formed on a layer of the printed circuit board and substantially surrounding the second aperture; and
   a magnetic core having a first leg passing through the first aperture, a second leg passing through the second aperture, and a third leg free of a coil winding passing through the third aperture, the third leg having a gap.

2. The output filter of claim 1 wherein the printed circuit board comprises a multilayer printed circuit board.

3. The output filter of claim 1 wherein the first coil winding comprises etched copper.

4. The output filter of claim 1 wherein the printed circuit board comprises at least one via that electrically couples the first coil winding to the second coil winding.

5. The output filter of claim 1 further comprising a plurality of coil windings formed on multiple layers of the printed circuit board, each of the plurality of coil windings being electrically coupled together.

6. The output filter of claim 1 wherein the first coil winding comprises a helical geometry.

7. The output filter of claim 1 wherein the first coil winding comprises a circular spiral pattern.

8. The output filter of claim 1 wherein the first coil winding comprises a rectangular spiral pattern.

9. The output filter of claim 1 wherein the magnetic core comprises multiple sections, the multiple sections being coupled together from opposite sides of the printed circuit board.

10. The output filter of claim 9 wherein the multiple sections are coupled together using a mechanical clamp.

11. The output filter of claim 9 wherein the multiple sections are coupled together with adhesive.

12. The output filter of claim 1 wherein the audio amplifier comprises a switching amplifier.

13. The output filter of claim 1 wherein the tank circuit inductor is formed on at least one layer of the printed circuit board.

14. The output filter of claim 1 wherein the tank circuit inductor is a discrete component.

15. The output filter of claim 1 wherein the tank circuit is also coupled to the second coil winding.

16. The output filter of claim 1 wherein the tank circuit is also coupled to a tap on the second coil winding at a point other than at an end of the second coil winding.

17. A method of manufacturing an output filter for an amplifier, the method comprising:
   forming a first aperture, a second aperture, and a third aperture through a printed circuit board;
   forming a first coil winding on a layer of the printed circuit board, the first coil winding substantially surrounding the first aperture;
   coupling a tank circuit comprising an inductor and a capacitor to a tap on the first coil winding at a point other than at an end of the first coil winding;
   forming a second coil winding on a layer of the printed circuit board, the first coil winding substantially surrounding the second aperture;
   inserting a first leg of a magnetic core through the first aperture, a second leg of the magnetic core through the second aperture, and a third leg of the magnetic core through the third aperture, the third leg free of a coil winding and having a gap.

18. The method of claim 17 further comprising forming a plurality of coil windings on multiple layers of the printed circuit board.

19. The method of claim 18 further comprising electrically coupling the plurality of coil windings formed on the multiple layers of the printed circuit board.

20. The method of claim 17 wherein the third aperture is located between the first and the second apertures.

21. The method of claim 17 wherein coupling the tank circuit to the tap comprises forming the tank circuit inductor on a layer of the printed circuit board.

22. An audio amplifier output filter comprising:
   a first inductor comprising a first coil winding receiving a first output signal from an audio amplifier;
   a tank circuit comprising an inductor and a capacitor and coupled to a tap on the first coil winding at a point other than at an end of the first coil winding;
   a second inductor comprising a second coil winding receiving a second output signal from the audio amplifier and
   a magnetic core coupling the first and second inductors and having a first leg passing through the first coil winding, a second leg passing through the second coil winding and a third leg free of a coil winding, and having a gap controlling a differential inductance that is less than a common mode inductance.

23. The audio amplifier output filter of claim 22 wherein the tank circuit is also coupled to a second tap on the second coil winding at a point other than at an end of the second coil winding.

24. An audio amplifier output filter comprising:
- a first inductor receiving a first output signal from an audio amplifier;
- a second inductor receiving a second output signal from the audio amplifier, the second inductor coupled to the first inductor; and
- a tank circuit comprising an inductor and a capacitor and connected between a first tap on the first inductor at a point other than at an end of the first inductor and a second tap on the second inductor at a point other than at an end of the second inductor.

25. The audio amplifier output filter of claim 24 further comprising a magnetic core coupling the first and second inductor.

26. The audio amplifier output filter of claim 25 wherein the first inductor includes a first coil winding encircling a first leg of the magnetic core and the second inductor includes a second coil winding encircling a second leg of the magnetic core.

27. The audio amplifier output filter of claim 26 where the first coil winding includes a first spiral winding disposed on a first surface of a printed circuit board and a second spiral winding disposed on a second surface of the printed circuit board.

28. The audio amplifier output filter of claim 24 wherein the audio amplifier is a bridge-tied load amplifier.

* * * * *